(12) United States Patent  (10) Patent No.: US 12,538,536 B2
Bellini et al.  (45) Date of Patent: Jan. 27, 2026

(54) POWER SEMICONDUCTOR DEVICE AND OPERATING METHOD

(71) Applicant: Hitachi Energy Ltd, Zürich (CH)

(72) Inventors: Marco Bellini, Zürich (CH); Jan Vobecky, Prague (CZ); Lars Knoll, Hägglingen (CH); Gianpaolo Romano, Baden (CH); Giovanni Alfieri, Möriken (CH)

(73) Assignee: HITACHI ENERGY LTD, Zürich (CH)

( * ) Notice: Subject to any disclaimer, the term of this patent is extended or adjusted under 35 U.S.C. 154(b) by 500 days.

(21) Appl. No.: 18/028,454

(22) PCT Filed: Nov. 6, 2020

(86) PCT No.: PCT/EP2020/081287
§ 371 (c)(1),
(2) Date: Mar. 24, 2023

(87) PCT Pub. No.: WO2022/096120
PCT Pub. Date: May 12, 2022

(65) Prior Publication Data
US 2023/0369408 A1  Nov. 16, 2023

(51) Int. Cl.
*H10D 62/17* (2025.01)
*H10D 30/66* (2025.01)
(52) U.S. Cl.
CPC ........... *H10D 62/307* (2025.01); *H10D 30/66* (2025.01); *H10D 30/668* (2025.01)
(58) Field of Classification Search
None
See application file for complete search history.

(56) References Cited

U.S. PATENT DOCUMENTS

| 5,233,214 | A | 8/1993 | Gorlach et al. |
| 7,518,451 | B2 | 4/2009 | Pribble et al. |
| 7,880,272 | B2 | 2/2011 | Schmidt |
| (Continued) | | | |

FOREIGN PATENT DOCUMENTS

| JP | 2009-278067 A | 11/2009 |
| JP | 2012-186324 A | 9/2012 |
| (Continued) | | |

OTHER PUBLICATIONS

Noguchi et al., "Channel engineering of 4H-SIC MOSFETs using sulphur as a deep level donor". 978-1-7281-1987-8/18/$31.00 © 2018 IEEE, IEDM18-185, 8.3.1 to 8.3.4, IEDMI8-185-IEDMI18-188.

(Continued)

*Primary Examiner* — Jack S Chen
(74) *Attorney, Agent, or Firm* — PROCOPIO, CORY, HARGREAVES & SAVITCH LLP

(57) ABSTRACT

A power semiconductor device is provided. In an embodiment, the power semiconductor device comprises a source region, a channel region in the semiconductor body, and a gate electrode at the channel region. The gate electrode is electrically insulated from the semiconductor body. The channel region is of a second conductivity type different from the first conductivity type. The channel region comprises a first dopant having an activation energy of at most 0.15 eV, and a second dopant having an activation energy of at least 0.3 eV.

20 Claims, 6 Drawing Sheets

(56) References Cited

U.S. PATENT DOCUMENTS

Figure 1:
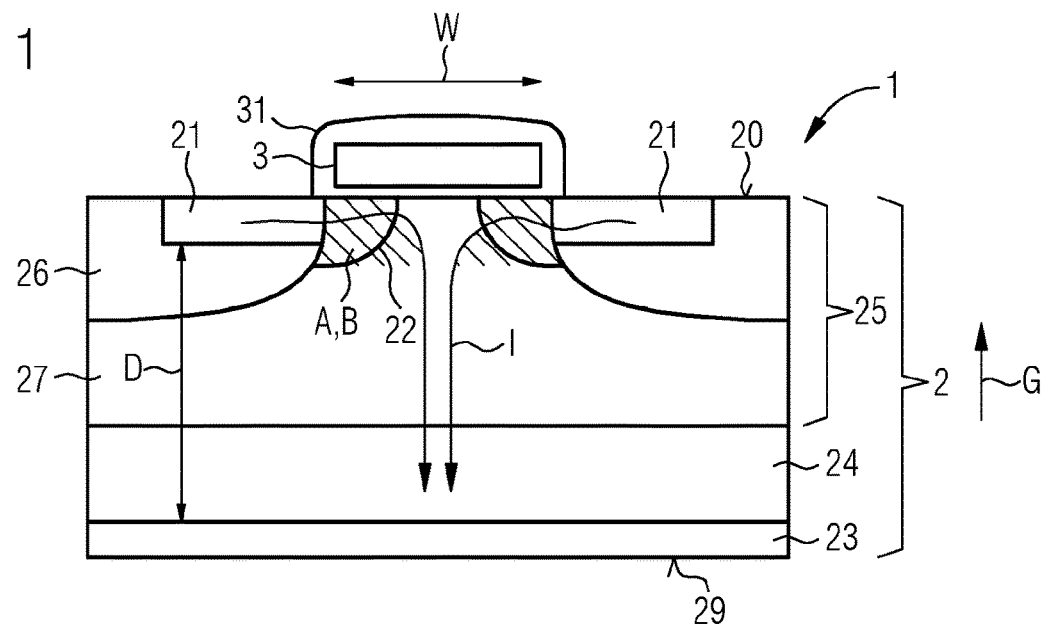

| | | |
|---|---|---|
| 2014/0001514 A1 | 1/2014 | Schulze et al. |
| 2015/0008446 A1 | 1/2015 | Losee et al. |
| 2016/0035836 A1 | 2/2016 | Konstantinov |
| 2020/0161437 A1 | 5/2020 | Meiser et al. |
| 2023/0369408 A1* | 11/2023 | Bellini ................ H10D 30/668 |

FOREIGN PATENT DOCUMENTS

| | | |
|---|---|---|
| JP | 2013-235891 A | 11/2013 |
| JP | 2015-15468 A | 1/2015 |
| WO | 2019171678 A1 | 9/2019 |

OTHER PUBLICATIONS

Miyata et al., "Ab initio study of substitutional impurity atoms in 4 H-SiC", AIP: Journal of Applied Physics, 104, 123702, 2008, http://dx.doi.org/10.1063/1.3041650, 5 pages.

Matsuura, "Density and energy level of a deep-level Mg aceptor in 4H-SiC", Japanese Journal of Applied Physics, Jan. 2015, DOI: 10.7567/JJAP.54.011301, https://www.researchgate.net/publication/270573134, 8 pages.

Saks et al., "High temperature high-dose implantation of aluminum in 4H-SiC", Jun. 21, 2004, AIP Publishing, Applied Physics Letters, vol. 84, No. 25, 4 pages.

Weiße et al., "Aluminum acceptor activation and charge compensation in implanted p-type 4H-SiC", May 9, 2019, AIP Advances 9, 055308 (2019), 5 pages. DOI: https://doi.org/10.1063/1.5096440.

* cited by examiner

POWER SEMICONDUCTOR DEVICE AND OPERATING METHOD

The present application is a national stage entry of International Patent Application No. PCT/EP2020/081287, filed on Nov. 6, 2020, which is hereby incorporated herein by reference as if set forth in full.

A power semiconductor device is provided. An operating method for such a power semiconductor device is also provided.

Document H. Matsuura et al., "Density and energy level of a deep-level Mg acceptor in 4H-SiC", Japanese Journal of Applied Physics, January 2015, 54(1):011301, DOI: 10.7567/JJAP.54.011301, refers to doping of SiC with Mg.

Document M. Noguchi et al., "Channel engineering of 4H-SiC MOSFETs using sulphur as a deep level donor", 2018 IEEE International Electron Devices Meeting (IEDM), San Francisco, CA, 2018, pp. 8.3.1-8.3.4, DOI: 10.1109/IEDM.2018.8614598, refers to doping of SiC with sulfur to achieve a higher threshold voltage in a MOSFET.

Document US 2016/0035836 A1 refers to using different dopants.

A problem to be solved is to provide a power semiconductor device having a self-heating current protection.

This object is achieved, inter alia, by a power semiconductor device and by an operating method as defined in the independent patent claims. Exemplary further developments constitute the subject matter of the dependent patent claims.

For example, the power semiconductor device, that could be a field-effect transistor or a bipolar transistor with an insulated gate, uses a first dopant with a low activation energy and a second dopant with a high activation energy so that the second dopant becomes relevant only well above a design operating temperature range. When the second dopant is significantly activated at elevated temperature, current choking occurs so that the self-heating current protection is achieved.

In at least one embodiment, the power semiconductor device comprises at least one source region and optionally a drain region of a first conductivity type or a collector layer of a second semiconductor type in a semiconductor body. Moreover, in the semiconductor body there is at least one channel region that, for example, is electrically, not necessarily geometrically, between the at least one assigned source region and the drain region or collector layer. A gate electrode is located at the at least one channel region and is electrically insulated from the semiconductor body. The at least one channel region is of a second conductivity type different from the first conductivity type. The at least one channel region comprises a first dopant having an activation energy of at most 0.15 eV, and a second dopant having an activation energy of at least 0.3 eV.

According to at least one embodiment, that the channel region is electrically between the assigned source region and the drain region or collector layer may mean that in the intended use of the power semiconductor device a current can flow from the respective source region and to the drain region or collector layer only through the assigned channel region.

If the power semiconductor device is a field-effect transistor, said channel region may be in direct contact with the respective source region and/or with the drain region, or the channel region may be distant from the source region and/or from the drain region because of at least one other, intermediate further region of the semiconductor body like a drift region. The further region, like the drift region, may be of the first conductivity type.

If the power semiconductor device is a bipolar transistor with an insulated gate, the channel region may be in direct contact with a collector layer of the second conductivity type, or the channel region may be distant from the source region and/or from the collector layer because of at least one other, intermediate further region of the semiconductor body like the drift region. The source region may also be referred to as emitter region, for example, if the power semiconductor device is the bipolar transistor with the insulated gate. However, because of their similar function, the terms 'source region' and 'emitter region' are used synonymously herein.

There can be more than one source region. For example, seen in top view of the gate electrode, there is at least one source region on each long side of the gate electrode. In this case, there can be one drain region or one collector layer assigned to all the source regions.

The gate electrode may be applied on and/or in the semiconductor body. Between the gate electrode and the semiconductor, there is an electrically insulating material like a gate oxide. By means of electrically addressing the gate electrode, a current flow through the channel region can be controlled in the intended use of the power semiconductor device.

There can be only one first dopant or there is a plurality of first dopants. Further, there may be only one second dopant or there is a plurality of second dopants. Optionally, there can be further dopants; however, there may be only the at least one first dopant and the at least one second dopant.

Thus, the power semiconductor device described herein may refer to a SiC short circuit protection based on the at least one temperature-activated second dopant.

Thus, an idea used in the present power semiconductor device is the introduction of a current-limiting layer into the channel region of, for example, a SiC MOSFET that will automatically protect the device from short-circuit or severe overcurrent or overload conditions, for example, in case of driving a motor or an inductive load. This may be achieved by at least one of the following effects:

increasing a threshold voltage at very high temperatures well above a design operating range, and/or increasing a resistivity of, for example, a JFET region of the power semiconductor device at very high temperatures well above the normal operating temperature range.

The current-limiting layer is realized, for example, by p-type second dopants that are situated at deeper energy levels in the bandgap compared to Al or B as first dopants in SiC which are mostly ionized at room temperature. These deep levels acting as p-type dopants are not ionized at low operation temperatures, so that in normal operating conditions the contribution of such a current-limiting layer is modest and does not degrade the mobility in the channel region or accumulation region of the device.

However, as temperature increases, the additional, second p-dopant activates and increases the effective doping of the channel region, and hence leads to at least one of:

increasing the threshold voltage, if implanted under the channel region, thereby limiting the current, creating a p-dopant region that chokes the current flow in, for example, the JFET region.

The power semiconductor device described herein is or is comprised in, for example, a MOS-based SiC trench device or planar device such as MOSFETs and IGBTs. Hence, the power semiconductor device is or can be present in, for example, a device selected from the group comprising or consisting of a metal-oxide-semiconductor field-effect transistor (MOSFET), a metal-insulator-semiconductor field-effect transistor (MISFET), an insulated-gate bipolar transistor (IGBT), a bipolar junction transistor (BJT), and a junction gate field-effect transistor (JFET). The power semiconductor device described herein may also be part of a thyristor like a gate turn-off thyristor (GTO) or a gate commutated thyristor (GCT).

Thus, it is proposed to implement a current-limiting layer with $p^+$-type first dopants that will be ionized at room temperature and energetically deeper p-type second dopants within the bandgap of SiC that will ionize only at high temperature. The deep p-type second dopants can be situated either near doped wells or in the JFET region of a planar MOSFET, but the implementation as a trench device is also possible.

In the following, the focus is on deep p-type second dopants although it would be possible to generalize to deep n-type second dopants in the case of n-channel region devices. The first and/or the second dopants could be either implanted or grown as part of an epitaxial layer.

According to at least one embodiment, the semiconductor body is of a silicon-based semiconductor material, like SiC or Si, or the semiconductor body is of a compound-semiconductor material, for example of a III-V compound-semiconductor material like GaN. The semiconductor body could partially or completely be a substrate doped by, for example, implantation of ions or by thermal treatment. Moreover, the semiconductor body could partially or completely be an epitaxially grown layer or layer sequence, doped during growth or doped afterwards by, for example, implantation of ions or by thermal treatment. The semiconductor body may be of only one semiconductor material, but a semiconductor body comprising a plurality of semiconductor materials is also possible.

According to at least one embodiment, the first dopant is at least one of B, Al, Ga. This may apply for a semiconductor body made of SiC.

If the semiconductor body is of Si, the first dopant may be at least one of B, Al, Ga, too. If the semiconductor body is of GaN, the first dopant may be Si or Ge.

According to at least one embodiment, the second dopant is selected from the following group: Be, Cd, In, Mg, Zn. This may apply for a semiconductor body made of SiC.

If the semiconductor body is of Si, the second dopant may be at least one of Co, Mn, S, Tl, Zn. If the semiconductor body is of GaN, the first dopant may be Mg.

According to at least one embodiment, the first dopant is Al and the second dopant is Mg. This may apply for a semiconductor body made of SiC.

According to at least one embodiment, the first conductivity type is n and the second conductivity type p. However, it is also possible that the first conductivity type is p and the second conductivity type n. In the following, primarily the first-mentioned case, that is, the first conductivity type is n and the second conductivity type p, will be discussed, but the presented information applies in the same manner for the second-mentioned case, that is, the first conductivity type is p and the second conductivity type n.

According to at least one embodiment, the power semiconductor device is configured for an operating temperature of at least 200 K or of at least 250 K and/or of at most 550 K or of at most 450 K or of at most 380 K. Hence, an intended operating temperature range may be 250 K to 450 K inclusive or 250 K to 380 K inclusive.

According to at least one embodiment, in the operating temperature range an activation level of the second dopant is at most $10^{-5}$ or of at most $10^{-4}$ or of at most $10^{-2}$. Hence, in the intended operating temperature range the power semiconductor device is designed for the second dopant to be essentially not activated and, thus, to have no or no significant influence on the operating characteristics. For example, in the operating temperature range an activation level of the first dopant exceeds the activation level of the second dopant by at least a factor of 10 or by at least a factor of 50 or by at least a factor of 100 or by at least a factor of 103. The activation level may be the proportion of the respective dopant that is activated and/or ionized.

According to at least one embodiment, a maximum doping concentration of the second dopant in the channel region is at least $10^{15}$ cm$^{-3}$ or at least $10^{16}$ cm$^{-3}$ or at least $1\times10^{17}$ cm$^{-3}$ or at least $5\times10^{17}$ cm$^{-3}$. Alternatively or additionally, the maximum doping concentration of the second dopant in the channel region is at most $5\times10^{19}$ cm$^{-3}$ or at most $1\times10^{19}$ cm$^{-3}$ or at most $10^{18}$ cm$^{-3}$ or at most $5\times10^{17}$ cm$^{-3}$. For example, the maximum doping concentration of the second dopant in the channel region is between $5\times10^{16}$ cm$^{-3}$ and $5\times10^{18}$ cm$^{-3}$ inclusive or between $1\times10^{17}$ cm$^{-3}$ and $1\times10^{18}$ cm$^{-3}$ inclusive.

According to at least one embodiment, the doping concentration of the first dopant in the channel region exceeds the doping concentration of the second dopant in the channel region, for example, by at least a factor of 1.2 or by at least a factor of 1.5 or by at least a factor of 1.8.

Alternatively or additionally, the doping concentration of the first dopant in the channel region exceeds the doping concentration of the second dopant by at most a factor of 5 or by at most a factor of 3 or by at most a factor of 2. This may apply to part of the channel region or to the whole channel region.

Alternatively, the maximum doping concentration of the first dopant in the channel region is smaller than the doping concentration of the second dopant in the channel region, for example, by at least a factor of 1.2 or by at least a factor of 1.5 or by at least a factor of 3. Alternatively or additionally, the maximum doping concentration of the first dopant in the channel region is smaller than the doping concentration of the second dopant by at most a factor of 10 or by at most a factor of 5 or by at most a factor of 3.

In other words, the first dopant and the second dopant can have similar doping concentrations.

According to at least one embodiment, the first dopant and the second dopant have different doping profiles. This applies exemplarily for a depth profile of the dopants, that is, for example, along a growth direction of the semiconductor body and/or along a perpendicular to the gate electrode. For example, an average implantation depth of the first dopant, like Al, is greater than an average implantation depth of the second dopant, like Mg. As an option, the average implantation depth of the first dopant exceeds the average implantation depth of the second dopant by at least a factor of 1.2 or by at least a factor of 1.5 and/or by at most a factor of 5 or by at most a factor of 2.

Seen in top view of the gate electrode it is possible that the first dopant and the second dopant have the same or approximately the same distribution. For example, the first dopant as well as the second dopant are applied using the same doping mask.

According to at least one embodiment, the whole channel region is doped with the second dopant. This may apply in top view of the gate electrode and, thus, of the power semiconductor device. Hence, seen in top view, there can be a continuous path of the second dopant running from the source region to the drain region or collector layer or to the drift region.

According to at least one embodiment, the channel region is only partially doped with the second dopant. This may apply in top view of the gate electrode and, thus, of the power semiconductor device. Hence, seen in top view, there is no continuous path of the second dopant running from the source region to the drain region or collector layer or to the drift region.

According to at least one embodiment, a central part of the gate electrode and/or of the channel region, seen in top view of the gate electrode, is free of the second dopant. For example, the second dopant is then limited to one or to a plurality of edge areas of the channel region, seen in top view of the gate electrode. The at least one edge area may directly adjoin the at least one source region.

In the present context, free of a dopant may mean that a concentration of the respective dopant is at most $1 \times 10^{14}$ cm$^{-3}$ or at most $1 \times 10^{15}$ cm$^{-3}$.

According to at least one embodiment, the second dopant is implanted in the channel region with a depth of at least 0.1 µm or of at least 0.2 µm. Alternatively or additionally, the second dopant is implanted in the channel region with a depth of at most 2 µm or of at most 1 µm. Thus, the second dopant may be doped with a comparably shallow profile.

According to at least one embodiment, the power semiconductor device is of a planar type. For example, the gate electrode is then applied only atop the semiconductor body without penetrating the semiconductor body. In this case, the semiconductor body could have a plane top face at which all the electrodes can be applied.

According to at least one embodiment, the power semiconductor device is of a trench type. For example, the gate electrode then penetrates the semiconductor body. For example, the semiconductor body could have a recess that may be generated by dry etching which is completely or partially filled with a material of the gate electrode together with the gate insulating material. The recess may terminate in the drift region, for example. Alternatively or additionally, away from the top face the recess may completely run through the source region and/or through a well region. If the power semiconductor device is the bipolar transistor with the insulated gate, the recess may terminate distant from the collector layer.

If the power semiconductor device is the field-effect transistor, the drain region and the source region may be on two opposite long sides of the gate electrode at the top face of the semiconductor body, for example, seen in top view of the gate electrode. In this case, a current flows essentially only in a direction perpendicular with a growth direction of the semiconductor body from the source region to the drain region so that the field-effect transistor has a horizontal set-up.

Otherwise, the at least one source region and the drain region may be located on opposite sides of the semiconductor body. In such a configuration, a current flows essentially first in the direction perpendicular with a growth direction of the semiconductor body from the source region to beneath the gate electrode and then in parallel with the growth direction to the drain region.

According to at least one embodiment, the power semiconductor device is a power device. For example, the power semiconductor device is configured for a maximum current through the channel region of at least 10 A or of at least 50 A. As an option, the maximum current is at most 500 A. Alternatively or additionally, the power semiconductor device is configured for a maximum voltage of at least 0.65 kV or of at least 1.2 kV. As an option, the maximum voltage may be at most 6.5 kV.

According to at least one embodiment, a shortest distance between the source region and the drain region or collector layer is at least 0.5 µm or at least 1.0 µm. Alternatively or additionally, said distance is at most 0.1 mm or at most 20 µm or at most 10 µm. Hence, the distance between the source region and the drain region or collector layer is comparably large. Said distance may be measured along the growth direction of the semiconductor body or, in case of a field-effect transistor, in a direction in parallel with the top face of the semiconductor body, depending on the type of transistor design used.

According to at least one embodiment, a length of the long side of the gate electrode and/or of the channel region, seen in top view of the top face and/or in a direction perpendicular with a main current flow direction near the source region, is at least 1 µm or at least 10 µm. Alternatively or additionally, said length is at most 2 mm or at most 0.8 mm.

The power semiconductor device is, for example, for a power module in a vehicle to convert direct current from a battery to alternating current for an electric motor, for example, in hybrid vehicles or plug-in electric vehicles.

A method for operating the power semiconductor device is additionally provided. By means of the method, a power semiconductor device is operated as indicated in connection with at least one of the above-stated embodiments. Features of the power semiconductor device are therefore also disclosed for the method and vice versa.

In at least one embodiment, the operating method is for a power semiconductor device. At room temperature, the first dopant is activated but not the second dopant.

According to at least one embodiment of the method, the second dopant serves as a self-heating current protection, that is, as a component that leads to self-limiting the current. Otherwise, without the second dopant, when current increases temperature increases, too, leading to a higher conductivity in the semiconductor body leading to a higher current and so on.

By having the second dopant, the threshold voltage at the gate, at which the power semiconductor device becomes conductive, increases with increasing temperature so that the afore-mentioned effect is avoided or reduced. That is, above an operating temperature limit the second dopant is activated, so that above the operating temperature limit an effective doping concentration increases and therefore a threshold voltage of the power semiconductor device is increased, too, and so that a current through the channel region is decreased with rising temperature. The operating temperature limit is, for example, the upper limit of the operating temperature range.

A power semiconductor device and a method described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

Figure 3:
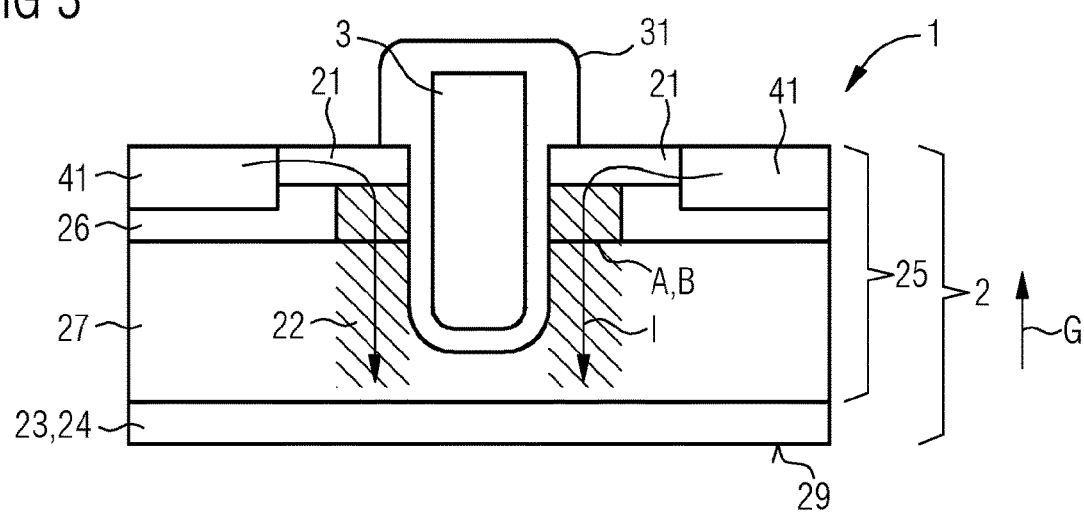
Figure 4:
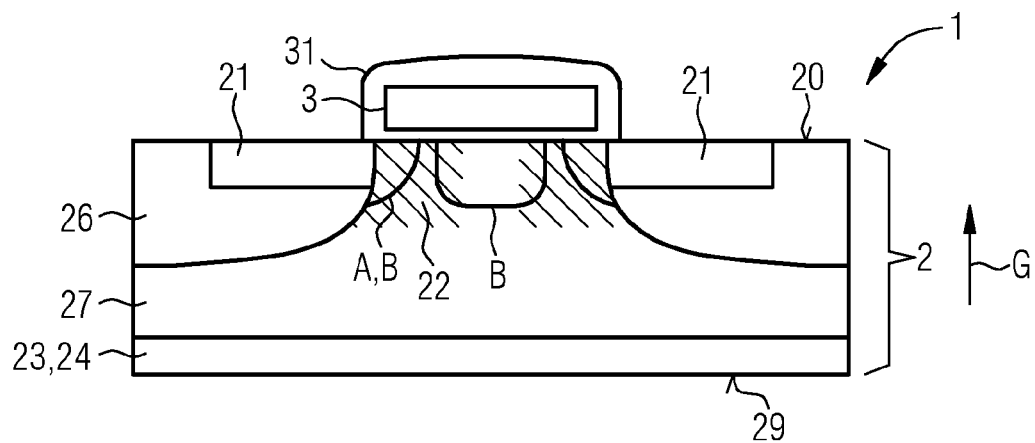
Figure 5:
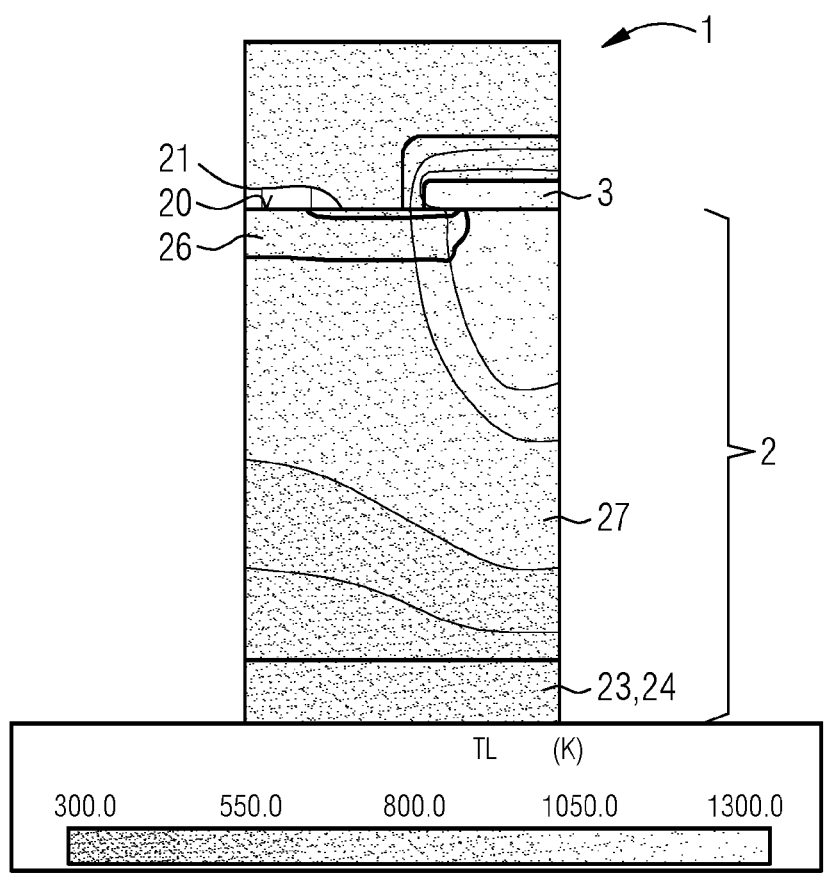
Figure 6:
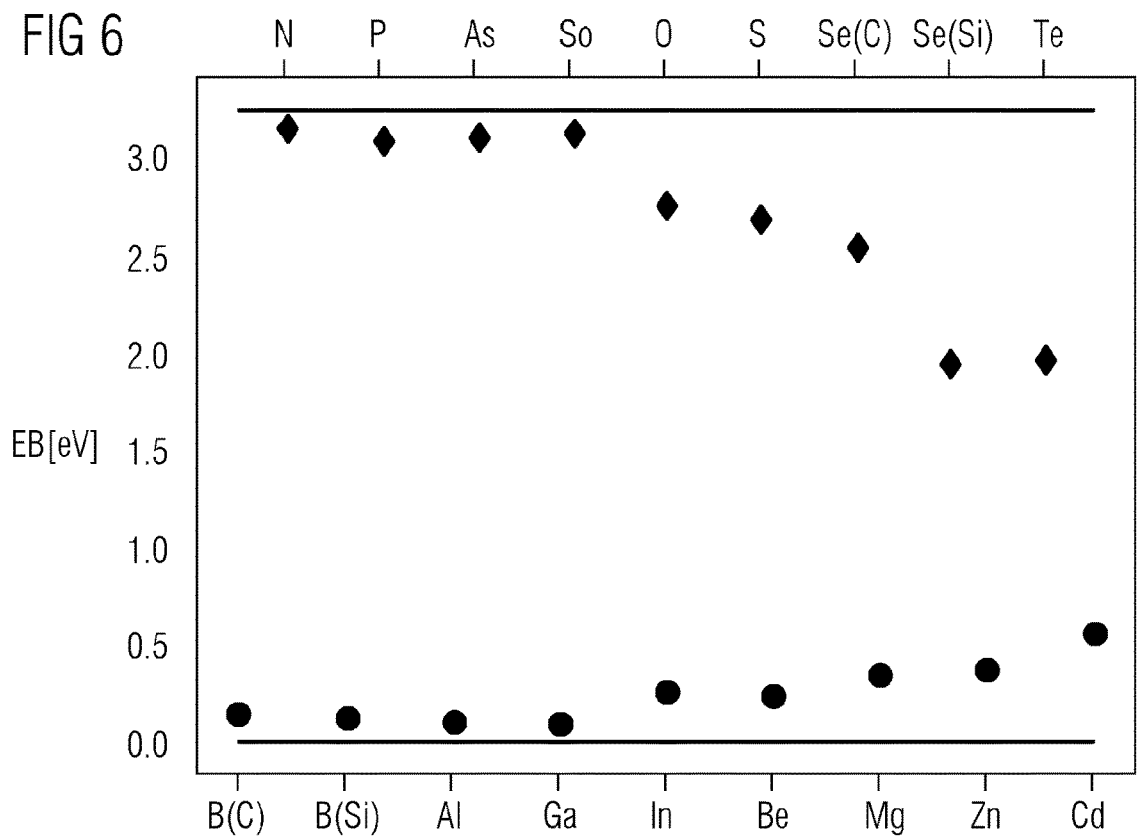
Figure 7:
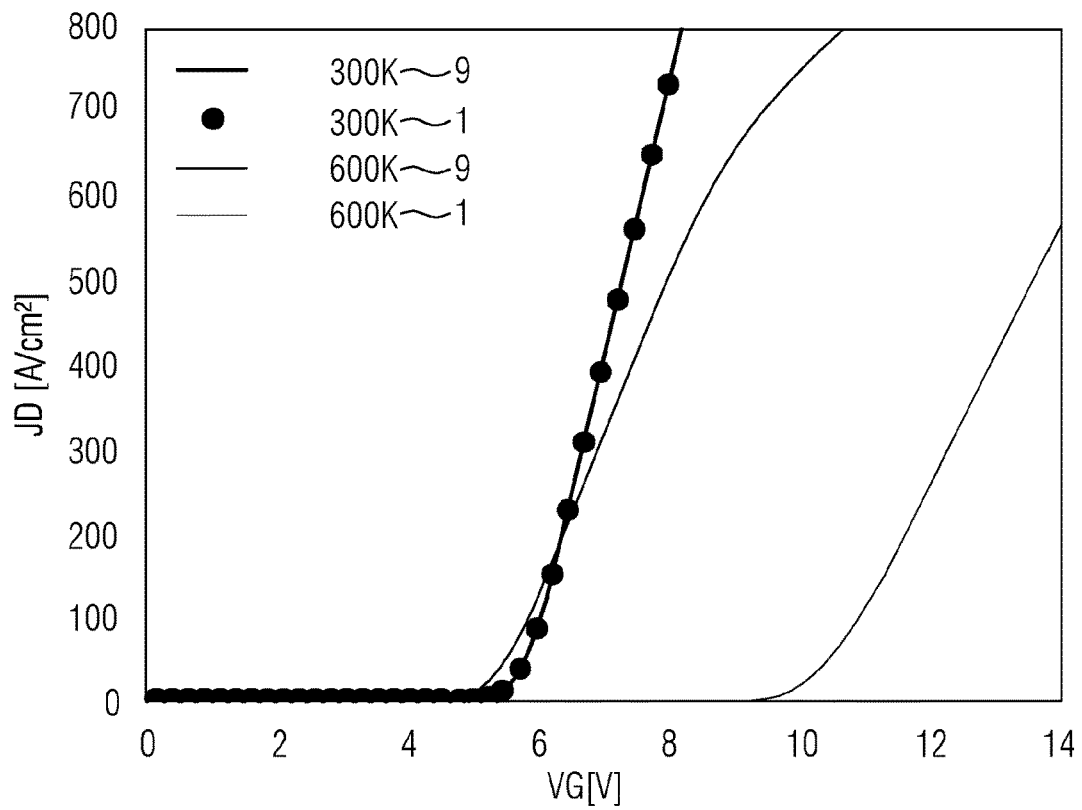
Figure 8:
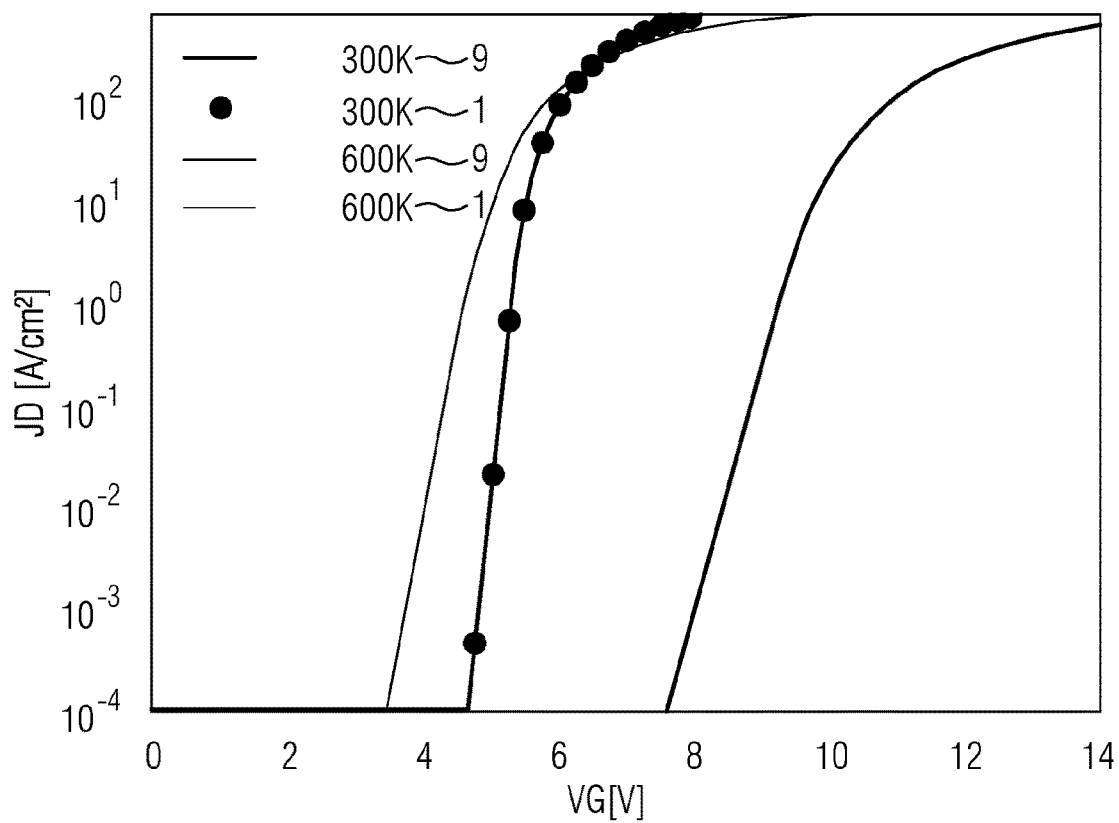
Figure 9:
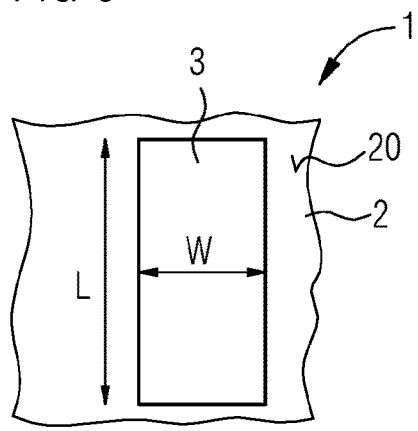
Figure 10:
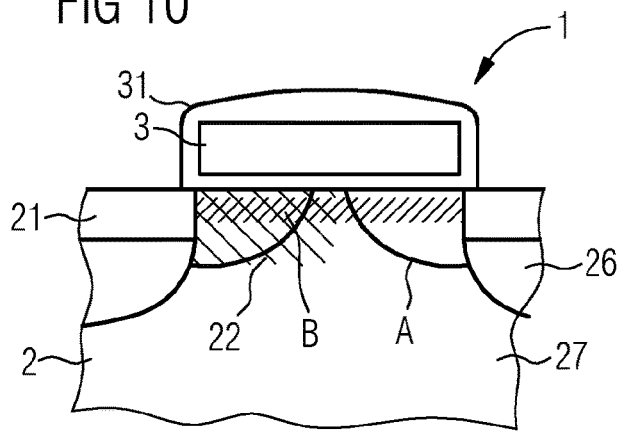
Figure 11:
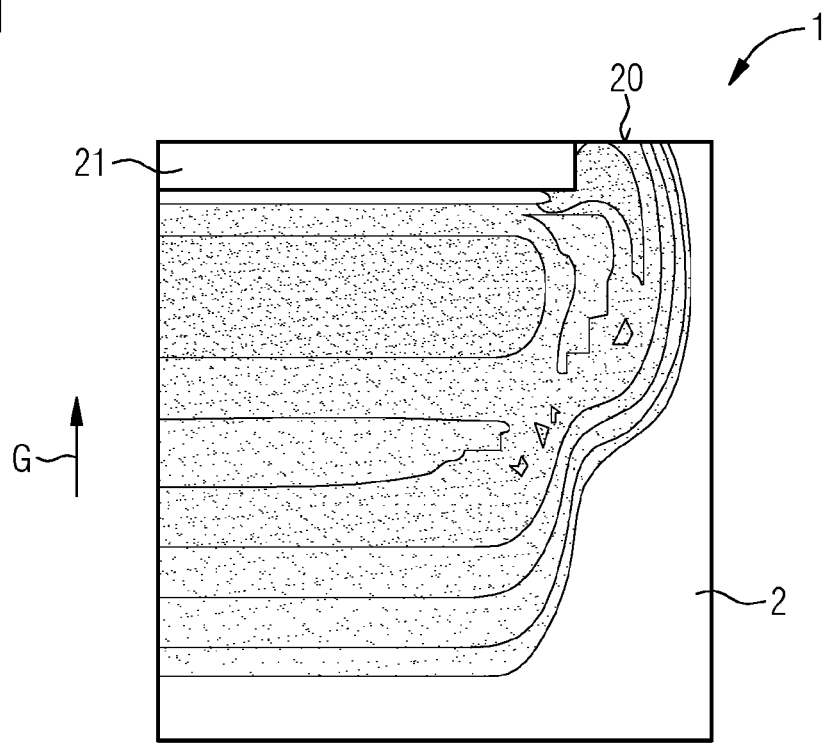
Figure 12:
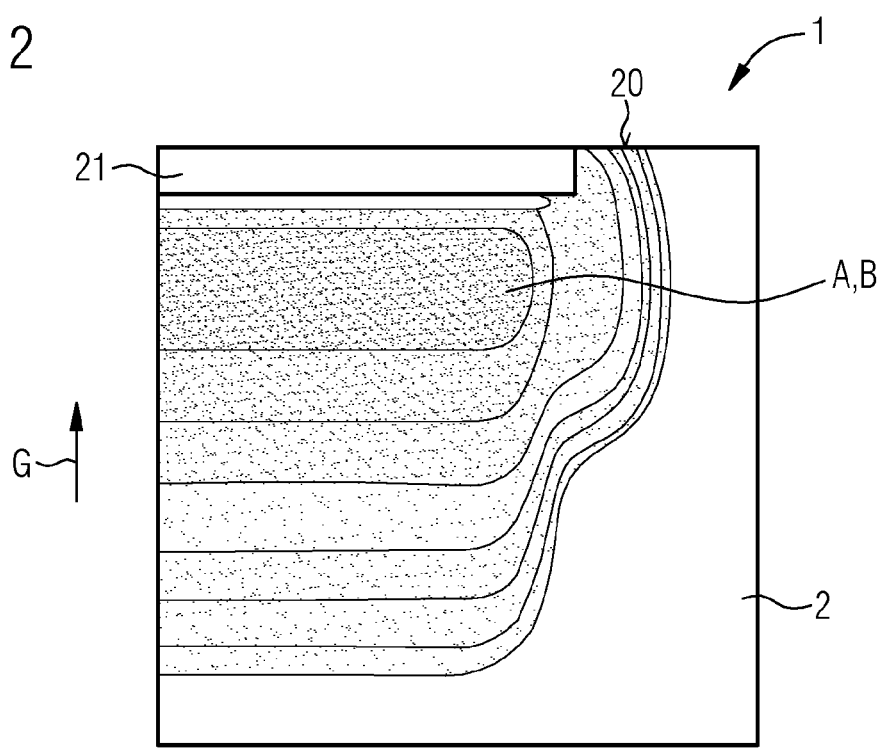
Figure 13:
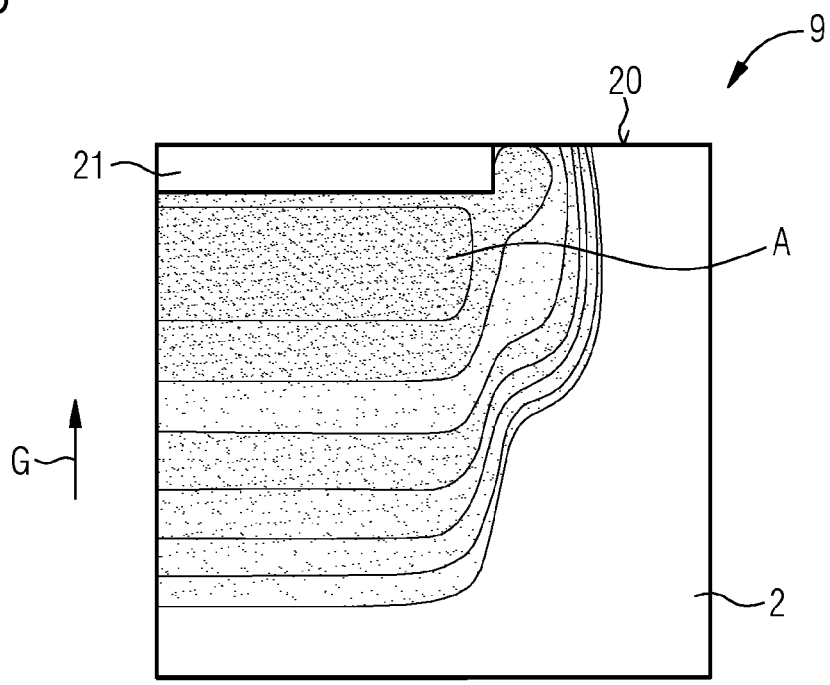

In the figures:

FIGS. 1, 14, 2, 3 and 4 are schematic sectional views of exemplary embodiments of power semiconductor devices described herein, FIG. 5 is a schematic representation of a temperature distribution of an exemplary embodiment of a power semiconductor device described herein in a sectional view, FIG. 6 is a schematic representation of bandgaps associated with different dopants for exemplary embodiments of power semiconductor devices described herein, FIGS. 7 and 8 are schematic representations of a temperature behavior of exemplary embodiments of power semiconductor devices described herein, FIG. 9 is a schematic top view of an exemplary embodiment of a power semiconductor device described herein, FIG. 10 is a schematic sectional view of an exemplary embodiment of a power semiconductor device described herein, and FIGS. 11 to 13 are schematic sectional views illustrating an effective dopant concentration.

FIG. 1 shows an exemplary embodiment of a power semiconductor device 1 configured as a field-effect transistor. The power semiconductor device 1 comprises a semiconductor body 2 having a substrate 24 and an epitaxially grown section 25. Contrary to what is shown in the exemplary embodiments, the semiconductor body 2 may in each case consist either of the substrate 24 or the epitaxially grown section 25, or there can be an epitaxially grown section 25 on each main side of the substrate 24.

In the semiconductor body 24, for example, in the epitaxially grown section 25, there are two source regions 21. Moreover, in the semiconductor body 24, for example, in or at the substrate 24, there is a drain region 23.

Along a growth direction G of the semiconductor body 2, that is, along a growth direction of the epitaxially grown section 25, there is a drift region 27 between the source regions 21 and the drain region 23. Further, each one of the source regions 21 is embedded in a well region 26.

Electrically between each one of the source regions 21 and the drain region 23 there is a channel region 22. Hence, current I flows from the source regions 21 to the drain region 23 through the channel regions 22. Accordingly, a main current flow direction is first in parallel with a top face 20 of the semiconductor body 2 in the channel regions 22 and is second in parallel with the growth direction G through a drift region 27 towards the drain region 23. The drift region 27 may reach the insulating material 31. This configuration can also be referred to as vertical set-up.

At the top face 20, there is a gate electrode 3 partially embedded in an insulating material 31 like a gate oxide.

External electrical connections to the gate electrode 3, to the source regions 21 and to the drain region 23 are not shown to simplify the drawing.

As an option, the channel regions 22 for the source regions 21 are not connected with each other so that in a central region below the gate electrode 3 there does not need to be a channel region.

Near the source regions 21 that can protrude beyond the gate electrode 3 there is a first region A being doped with a first dopant. Moreover, there is a second region B being doped with a second dopant. The regions A, B can be about the same, at least seen in top view of the top face 20. For example, the regions A, B are produced by means of ion implantation and the first and the second dopants may be implanted using the same mask.

The regions A, B may directly adjoin the source regions 21, but are separated from the drain region 23 by the drift region 27. In other words, the channel region 22 is limited by the source region 21 and the drift region 27. Accordingly, the channel region 22 and the first region A can be congruent or identical.

The second dopant has a higher activation energy so that the second dopant is activated only well above an operation temperature range the power semiconductor device 1 is configured for, while the first dopant is activated at room temperature, that is, at 300 K. Accordingly, by means of the second dopant a gate voltage VG at which the power semiconductor device 1 becomes conductive can be increased when temperature increases so that a self-heating current protection is achieved.

For example, the semiconductor body 2 is of SiC or is based on SiC, and the first dopant is Al and the second dopant is Mg.

In the following, exemplary geometric and doping characteristics are described. These characteristics may be applied to all exemplary embodiments, individually, all together or in any combination:

A maximum doping concentration of the second dopant in the channel region 22 and/or in the second region B is at least $1 \times 10^{16}$ cm$^{-3}$ and/or at most $1 \times 10^{18}$ cm$^{-3}$.

A maximum doping concentration of the first dopant in the channel region 22 and/or in the first region A is at least $1 \times 10^{16}$ cm$^{-3}$ and/or at most $1 \times 10^{18}$ cm$^{-3}$.

The first dopant can be Al so that the channel region 22 is p-doped. Accordingly, the well region 26 is also p-doped and the source region 21, the drift region 27 and the drain region 23 are n-doped. Of course, an opposite doping scheme can alternatively be used.

A maximum doping concentration of the drift region 27 may be at least $1 \times 10^{15}$ cm$^{-3}$ and/or at most $1 \times 10^{17}$ cm$^{-3}$. A maximum doping concentration of the well region 26 may be at least $5 \times 10^{17}$ cm$^{-3}$ and/or at most $5 \times 10^{19}$ cm$^{-3}$. A maximum doping concentration of the drain region 23 may be at least $1 \times 10^{20}$ cm$^{-3}$ and/or at most $1 \times 10^{22}$ cm$^{-3}$. As an n-dopant, P, N and/or As may be used.

A distance D between the source regions 21 and the drain region 23 along the growth direction G may be at least 5 µm or at least 10 µm and/or at most 0.2 mm or at most 60 µm. A thickness of the well region 26 may alternatively or additionally be at least 0.2 µm and/or at most 1 µm.

A width W of the gate electrode 3 may be at least 1 µm and/or at most 10 µm or at most 3 µm. A thickness of the insulating material 31 between the gate electrode 3 and the semiconductor body 2 may alternatively or additionally be at least 40 nm and/or at most 0.2 µm.

Contrary to what is shown in FIG. 1, the drain region 23 does not need to be located on a bottom face 29 of the semiconductor body 2 but may also be located within the semiconductor body 2, for example, at an interface between the substrate 24 and the epitaxially grown section 25.

Figure 14:
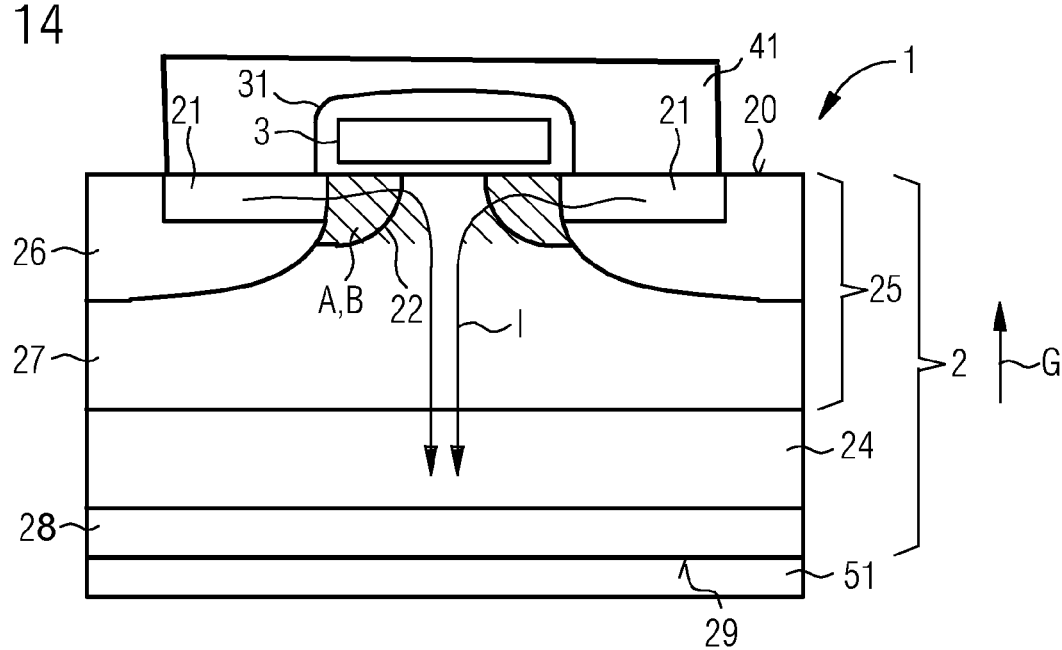

In the exemplary embodiment of FIG. 14, the power semiconductor device 1 is a bipolar transistor with an insulated gate, IGBT for short. Thus, for example, at a side of the substrate 24 remote from the gate electrode 3 the semiconductor body 2 comprises a collector layer 28. The collector layer 28 is of the same conductivity type as the well region 26. The collector layer 28 is either part of the substrate 24 and is doped, for example, by means of ion implantation, or the collector layer 28 is a further region epitaxially grown onto the substrate 24. In the embodiment of FIG. 14, the substrate 24 may also be regarded as drift region.

At a side of the collector layer 28 remote from the substrate 24, there is a collector electrode 51. The collector electrode 51 is a metallization applied to the semiconductor body 2, for example, directly on the collector layer 28. For example, there is one common collector layer 28 and one common collector electrode 51 for all the source regions 21.

As an option, there is a common metallic source electrode 41 for the two source regions 21 shown in FIG. 14, and such a source electrode 41 may be present in all other exemplary embodiments, too.

For example, the collector layer 28 is p$^+$-doped with a maximum doping concentration of at least $1\times10^{17}$ cm$^{-3}$ or at least $1\times10^{18}$ cm$^{-3}$ and/or of at most $1\times10^{21}$ cm$^{-3}$. Hence, the power semiconductor device 1 of FIG. 14 comprises, for example, a npnp semiconductor layer sequence composed of the source region 21, the well region 26, the drift region 27 together with the substrate 24, and the collector layer 28.

Otherwise, the same as to FIG. 1 also applies to FIG. 14.

Figure 2:
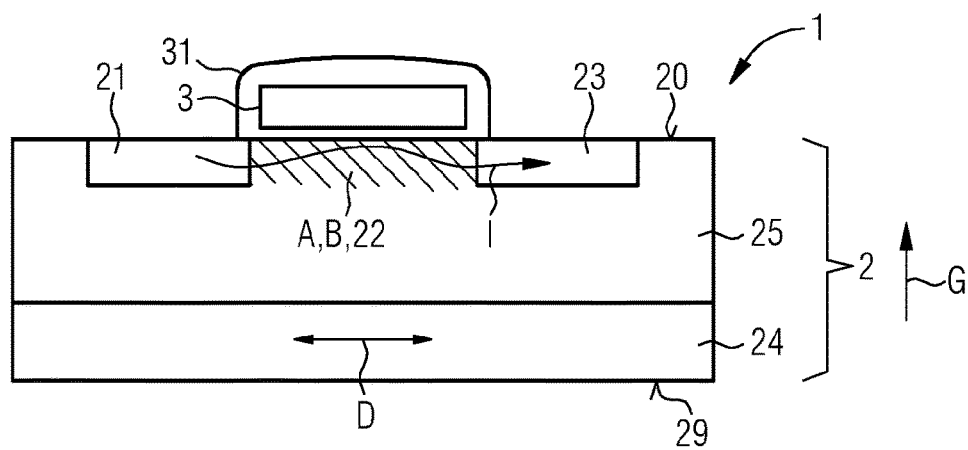

The power semiconductor device 1 in the exemplary embodiment of FIG. 2 is of a horizontal set-up field-effect transistor type. Thus, both the source region 21 and the drain region 23 can be located at the top face 20 so that the bottom face 29 may be free of an electrode.

Thus, the channel region 22 ranges directly from the source region 21 to the drain region 23 and no drift region needs to be involved. Current I flows essentially in parallel with the top face 20. The channel region 22 can completely be provided with the second dopant so that the first region A and the second region B may completely extend to an area beneath the gate electrode 3.

Other than shown in FIG. 2, the second region B may be limited to only part of the channel region 22, for example, to an edge area directly at the source region 21 similar to FIG. 1. An extent of the edge area is, for example, at least 20% and/or at most 40% of the width of the gate electrode 3.

Otherwise, the same as to FIG. 1 also applies to FIG. 2.

According to the exemplary embodiment of FIG. 3, the gate electrode 3 is in part located in a trench in the semiconductor body 2. Hence, the channel regions 22 may run from the source regions 21 to the drain region 23 in parallel with the growth direction G. It is noted that no distinction is made between the terms 'parallel' and 'antiparallel'. For example, the trench and, thus, the gate electrode 3 reach deeper into the semiconductor body 2 than the source regions 21 and also deeper than the well region 26 and/or than the second region B having the second dopant.

Thus, in parallel with the growth direction G the channel regions 22 are directly between the source regions 21 and the drift region 27. In parallel with the top face 20, the well region 26 and the channel region 22 and, thus, the first region A and the second region B may directly adjoin one another or may be distant from one another. The regions A, B and the well region 26 may have different depths or alternatively the same depth.

At the top face 20, there can be the at least one source electrode 41.

According to the illustration of FIG. 3, the power semiconductor device 1 is a vertical set-up field-effect transistor. However, other than shown in FIG. 3 the power semiconductor device 1 could also comprise the collector layer and could thus be an IGBT like in FIG. 14.

Otherwise, the same as to FIGS. 1, 14 and 2 also applies to FIG. 3.

In the exemplary embodiment of FIG. 4, the first region A with the first dopant and the second region B with the second dopant are different from each other and may optionally not overlap at all. For example, the second region B is located beneath a central region of the gate electrode 3. The drift region 27 may also extend between the first region A directly at the source region 21 and the central second region B.

Thus, the channel regions 22 may reach into the second region B, but may not completely run through said second region B.

In the exemplary embodiment of FIG. 4, the vertical set-up of FIG. 1 is used, but the same can apply to the set-ups of FIGS. 2 and 3.

Otherwise, the same as to FIGS. 1 to 3 and 14 also applies to FIG. 4.

In FIG. 5, a typical temperature profile of an exemplary embodiment of the power semiconductor device 1 is illustrated. It can be seen that below the gate electrode 3 a comparably high lattice temperatures TL can be reached. Hence, damage due to too large currents and, hence, too high temperatures may occur which can be prevented by using the second dopant.

In FIG. 6, a bandgap EB for some dopants is illustrated, acceptors as circles, donors as rhombs. Accordingly, suitable 'deep', second dopants for SiC with a high activation energy may be, for example, In, Be, Mg, Zn and/or Cd as p-dopants. As an n-dopant for the second dopant, O, S, Se and/or Te may be used.

All the dopants could either be implanted or grown as part of the semiconductor body 2, for example, as part of the epitaxially grown section 25.

In FIGS. 7 and 8, transfer characteristics of the structures shown in FIG. 1 are illustrated in linear and logarithmic scale. It can be seen that in the exemplary power semiconductor device 1 at 300 K the second dopant, Mg in this case, does not have a significant influence on the transfer characteristics because at this temperature the second dopant is virtually not activated.

However, at 600 K well above an intended operation temperature range of the power semiconductor device 1 the gate voltage VG at which significant current densities JD occur is increased by about 4 V due to activation of the second dopant, compared with a power semiconductor device 9 without the second dopant. Hence, at a nominal operating voltage of about 8 V self-heating current protection can be achieved because of the second dopant.

In the top view of the exemplary embodiment of the power semiconductor device 1 as shown in FIG. 9 it can be seen that the gate electrode 3 may have the comparably small width W of, for example, 1.5 μm while a length L of long sides can be significantly larger and is, for example, between 0.01 mm and 1 μm inclusive.

Otherwise, the same as to FIGS. 1 to 8 and 14 also applies to FIG. 9.

In FIG. 10 it is illustrated that the second dopant and, thus, the second region B is near the top face 20, while the first dopant in the first region A has a greater average doping depth so that the first region A extends farer away from the top face 20 than the second region B.

The same can apply to all other exemplary embodiments. Otherwise, the same as to FIGS. 1 to 9 also applies to FIG. 10 and vice versa.

FIGS. 11 to 13 illustrate an effective dopant concentration. The darker the respective areas shown in FIGS. 11 to 13, the higher is the effective doping concentration, that is, the concentration of ions resulting from the at least one dopant at the respective temperature. In this respect, FIG. 11 refers to a temperature of 300 K, and FIGS. 12 and 13 refer to a temperature of 600 K. All FIGS. 11 to 13 refer to the basic set-up of FIG. 1, wherein in FIGS. 11 and 12 the second dopant is present and in FIG. 13 there is no second dopant.

According to FIG. 11, there is a comparably moderate effective doping concentration next to the source region 21 at 300 K because of Al as the first dopant, and Mg for the second dopant is not activated at this temperature. As can be seen from FIG. 12, the effective doping concentration at 600 K is significantly increased compared with FIG. 11 because both the first and second dopants are activated.

Contrary to that, see FIG. 13, with the first dopant only, that is, with only Al used for doping the channel region, the effective doping concentration at 600 K next to the source region 21 is by far lower than in the case illustrated in FIG. 12.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 power semiconductor device
2 semiconductor body
20 top face
21 source region
22 channel region
23 drain region
24 substrate
25 epitaxially grown section
26 well region
27 drift region
28 collector layer
29 bottom face
3 gate electrode
31 electrically insulating material
41 source electrode
51 collector electrode
9 power semiconductor device without second dopant
A first region having the first dopant
B second region having the second dopant
D distance between the source region and the drain region
EB bandgap
G growth direction
I current flow
JD current density
L gate length
TL lattice temperature
VG gate voltage
W gate width

The invention claimed is:

1. A power semiconductor device comprising:
a source region of a first conductivity type in a semiconductor body;
a channel region in the semiconductor body; and a gate electrode at the channel region which is electrically insulated from the semiconductor body,
wherein
the channel region of a second conductivity type different from the first conductivity type,
the channel region comprises a first dopant which is of the second conductivity type having an activation energy of at most 0.15 eV,
the channel region comprises a second dopant which is of the second conductivity type having an activation energy of at least 0.3 eV, and
the power semiconductor device is configured for an operating temperature range of at least 200 K to at most 500 K so that in the operating temperature range an activation level of the second dopant is at most $10^{-3}$.

2. The power semiconductor device of claim 1, wherein the semiconductor body is of SiC or of Si, wherein the first dopant is at least one of B, Al, or Ga, and wherein the second dopant is at least one of Be, Cd, Co, In, Mg, Mn, S, T, or Zn.

3. The power semiconductor device of claim 2, wherein the semiconductor body is of SiC and the first dopant is Al and the second dopant is Mg.

4. The power semiconductor device of claim 3, wherein the first conductivity type is n and the second conductivity type is p.

5. The power semiconductor device of claim 3, wherein a maximum doping concentration of the second dopant in the channel region is at least $10^{16}$ cm$^{-3}$ and is at most $10^{18}$ cm$^{-3}$.

6. The power semiconductor device of claim 2, wherein the first conductivity type is n and the second conductivity type is p.

7. The power semiconductor device of claim 2, wherein a maximum doping concentration of the second dopant in the channel region is at least $10^{16}$ cm$^{-3}$ and is at most $10^{18}$ cm$^{-3}$.

8. The power semiconductor device of claim 1, wherein the first conductivity type is n and the second conductivity type is p.

9. The power semiconductor device of claim 8, wherein a maximum doping concentration of the second dopant in the channel region is at least $10^{16}$ cm$^{-3}$ and is at most $10^{18}$ cm$^{-3}$.

10. The power semiconductor device of claim 1, wherein a maximum doping concentration of the second dopant in the channel region is at least $10^{16}$ cm$^{-3}$ and is at most $10^{18}$ cm$^{-3}$.

11. The power semiconductor device of claim 1, wherein a doping concentration of the first dopant in the channel region exceeds a doping concentration of the second dopant in the channel region at least locally by at least a factor of 1.5.

12. The power semiconductor device of claim 1, wherein the first dopant and the second dopant have different doping profiles.

13. The power semiconductor device of claim 1, wherein the whole channel region is doped with the second dopant.

14. The power semiconductor device of claim 1, wherein the channel region is only partly doped with the second dopant so that a central part of the semiconductor body below the gate electrode, seen in top view of the gate electrode, is free of the second dopant.

15. The power semiconductor device of claim 1, wherein the second dopant is applied in the channel region with a depth of at least 0.1 µm and of at most 2 µm.

16. The power semiconductor device of claim 1, which is of a planar type so that the gate electrode is applied only atop the semiconductor body without penetrating the semiconductor body.

17. The power semiconductor device of claim 1, which is of a trench type so that the gate electrode penetrates the semiconductor body and is at least partially located in a trench formed in the semiconductor body.

18. The power semiconductor device of claim 1, which is a power field-effect transistor or a power bipolar transistor with an insulated gate configured for a maximum current through the channel region of at least 10 A.

19. The power semiconductor device of claim 1, wherein a shortest distance between the source region and an associated collector layer, if the power semiconductor devices a power bipolar transistor with an insulated gate, or an associated drain region, if the power semiconductor devices a field-effect transistor, is between 0.5 µm and 20 µm inclusive.

20. An operating method for a power semiconductor device of claim 1,
wherein at room temperature the first dopant is activated but not the second dopant,
wherein as a self-heating current protection, above an operating temperature limit of the power semiconductor device, the second dopant is activated, too, so that above the operating temperature limit a threshold voltage of the power semiconductor devices increased and so that a current through the channel regions decreased with rising temperature.

* * * * *